(12) United States Patent
Bonwit et al.

(10) Patent No.: US 9,705,346 B2
(45) Date of Patent: Jul. 11, 2017

(54) ELECTRIC VEHICLE CHARGING STATION WITH CABLE RETAINING ENCLOSURE

(75) Inventors: Holden Alexander Bonwit, Los Angeles, CA (US); Greg A. Petrie, San Dimas, CA (US)

(73) Assignee: AeroVironment, Inc., Monrovia, CA (US)

( * ) Notice: Subject to any disclaimer, the term of this patent is extended or adjusted under 35 U.S.C. 154(b) by 885 days.

(21) Appl. No.: 13/607,666

(22) Filed: Sep. 8, 2012

(65) Prior Publication Data

US 2013/0181670 A1 Jul. 18, 2013

Related U.S. Application Data

(63) Continuation of application No. PCT/US2011/027620, filed on Mar. 8, 2011, and a continuation-in-part of application No. 29/360,300, filed on Apr. 22, 2010, now Pat. No. Des. 651,561, and a continuation-in-part of application No. 29/360,201, filed on Apr. 21, 2010, now Pat. No. Des. 652,791, application No. 13/607,666, which is a continuation-in-part of application No. PCT/US2011/027622, filed on Mar. 8, 2011, which is a continuation-in-part of application No. 29/360,300, filed on Apr. 22, 2010, now Pat. No. Des. 651,561,
(Continued)

(51) Int. Cl.
*H02J 7/00* (2006.01)
*H05K 5/02* (2006.01)
*B60L 11/18* (2006.01)

(52) U.S. Cl.
CPC ......... *H02J 7/0042* (2013.01); *B60L 11/1818* (2013.01); *B60L 11/1825* (2013.01); *H05K 5/02* (2013.01); *H05K 5/0217* (2013.01); *H05K 5/0247* (2013.01); *B60L 2230/12* (2013.01); *B60L 2230/16* (2013.01); *Y02T 10/7005* (2013.01); *Y02T 10/7088* (2013.01); *Y02T 90/121* (2013.01); *Y02T 90/128* (2013.01); *Y02T 90/14* (2013.01); *Y02T 90/163* (2013.01)

(58) Field of Classification Search
CPC ....................................................... Y02T 90/14
USPC ....................................................... 320/109
See application file for complete search history.

(56) References Cited

U.S. PATENT DOCUMENTS

| | | | |
|---|---|---|---|
| 5,306,999 A | * | 4/1994 | Hoffman ............ B60L 11/1818 320/109 |
| 5,445,252 A | | 8/1995 | McKee et al. |

(Continued)

OTHER PUBLICATIONS

The State Intellectual Property Office of the People's Republic of China (SIPO) Office Action (OA2) for corresponding Chinese Patent Application No. 201180023182.9 Entitled Electric Vehicle Charging Station with Cable Retaining Enclosure by Bonwit et al.; Issued May 5, 2015 from The State Intellectual Property Office of the People's Republic of China; 5 pgs.

(Continued)

*Primary Examiner* — Suresh Memula
(74) *Attorney, Agent, or Firm* — Christopher R. Balzan; Eric J. Aagaard

(57) ABSTRACT

In various embodiments, an enclosure for a charging station is provided having a peripheral casing configured to retain a charging cable on an upward facing surface of the peripheral casing between a front user interface side and a charging station mounting surface.

31 Claims, 16 Drawing Sheets

Related U.S. Application Data and a continuation-in-part of application No. 29/360,201, filed on Apr. 21, 2010, now Pat. No. Des. 652,791, application No. 13/607,666, which is a continuation-in-part of application No. PCT/US2011/027621, filed on Mar. 8, 2011, which is a continuation-in-part of application No. 29/360,300, filed on Apr. 22, 2010, now Pat. No. Des. 651,561, and a continuation-in-part of application No. 29/360,201, filed on Apr. 21, 2010, now Pat. No. Des. 652,791, application No. 13/607,666, which is a continuation-in-part of application No. PCT/US2011/000433, filed on Mar. 8, 2011.

(60) Provisional application No. 61/325,787, filed on Apr. 19, 2010, provisional application No. 61/339,749, filed on Mar. 8, 2010, provisional application No. 61/350,466, filed on Jun. 1, 2010, provisional application No. 61/460,413, filed on Dec. 29, 2010, provisional application No. 61/397,984, filed on Jun. 18, 2010.

(56) References Cited

U.S. PATENT DOCUMENTS

| | | | |
|---|---|---|---|
| 6,459,234 B2 * | 10/2002 | Kajiura | B60L 11/182 320/109 |
| D626,063 S | 10/2010 | Cutter et al. | |
| 2011/0061981 A1 | 3/2011 | Ori et al. | |
| 2011/0169447 A1 | 7/2011 | Brown et al. | |

OTHER PUBLICATIONS

Clippercreek,Inc., CS Series Public EVSE Brochure, ClipperCreek, Inc., www.ClipperCreek.net, 1 pg.

The State Intellectual Property Office of the People's Republic of China (SIPO) Office Action (1OA) and Search Report (Search_Rpt) for corresponding Chinese Patent Application No. 201180023182.9 Entitled Electric Vehicle Charging Station with Cable Retaining Enclosure by Bonwit et al.; Issued Jul. 3, 2014 from The State Intellectual Property Office of the People's Republic of China; 14 pgs.

International Searching Authority; (ISA/US) Written Opinion (WO) and Search History (History) for parent PCT case Application No. PCT/US2011/027620 entitled Electric Vehicle Charging Station with Cable Retaining Enclosure by Bonwit et al., mailed May 3, 2011; International Searching Authority/US; 15 pgs.

International Searching Authority; (ISA/US) International Search Report (ISR) for parent PCT case Application No. PCT/US2011/027620 entitled Electric Vehicle Charging Station with Cable Retaining Enclosure by Bonwit et al., mailed May 3, 2011; International Searching Authority/US; 2 pgs.

The State Intellectual Property Office of the People's Republic of China (SIPO) Office Action (OA3) for corresponding Chinese Patent Application No. 201180023182.9 Entitled Electric Vehicle Charging Station with Cable Retaining Enclosure by Bonwit et al.; Issued Jan. 26, 2016 from The State Intellectual Property Office of the People's Republic of China; 11 pgs.

* cited by examiner

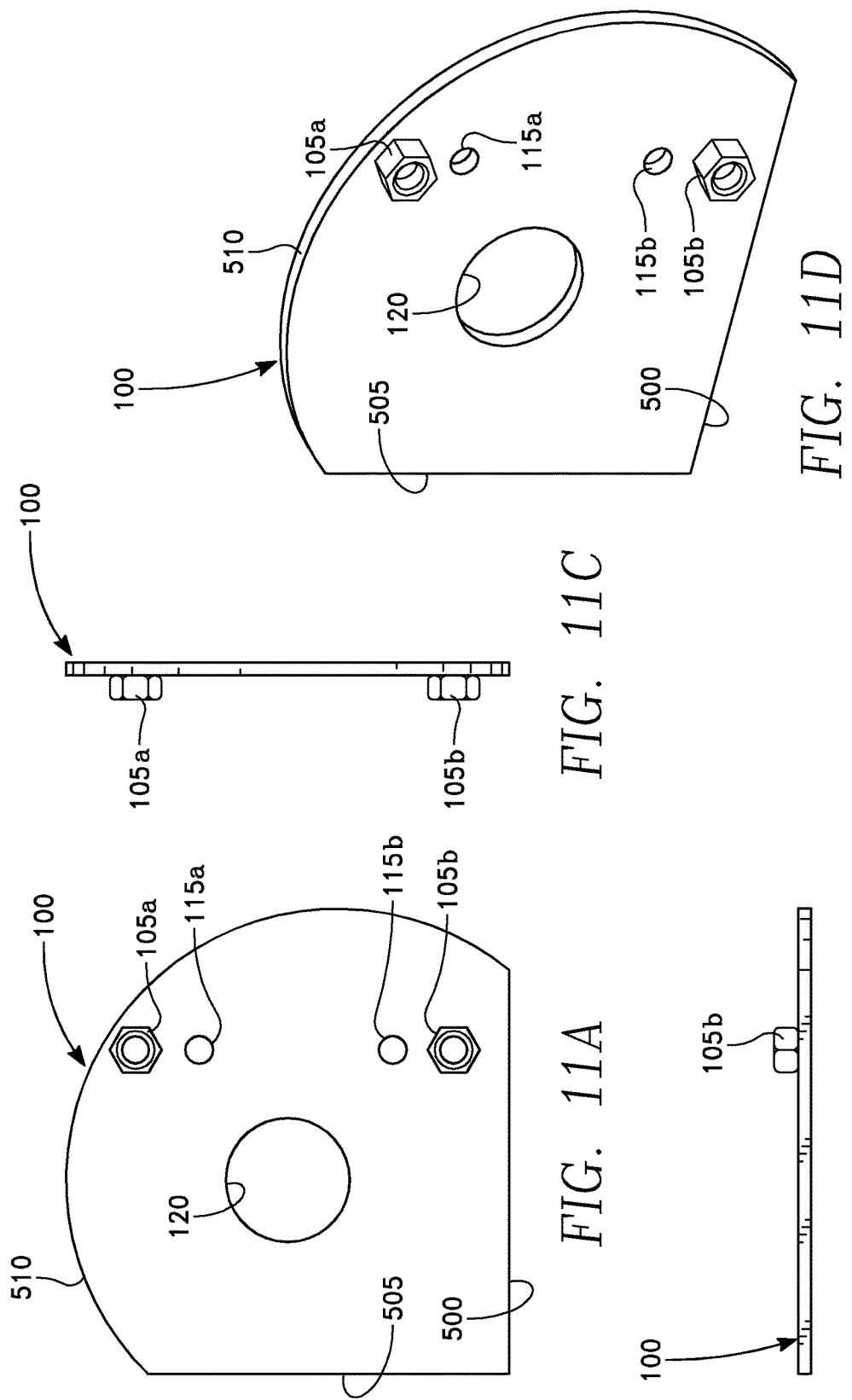

ELECTRIC VEHICLE CHARGING STATION WITH CABLE RETAINING ENCLOSURE

CROSS REFERENCED RELATED PATENT APPLICATIONS

The present application is a continuation of PCT Application Ser. No. PCT/US2011/027620, by Bonwit et al., entitled ELECTRIC VEHICLE CHARGING STATION WITH CABLE RETAINING ENCLOSURE, filed Mar. 8, 2011, herein incorporated by reference in its entirety.

PCT/US2011/027620 claims priority of the following U.S. Provisional Patent Applications all herein incorporated by reference in their entireties:
- Ser. No. 61/325,787, filed on Apr. 19, 2010, entitled An ELECTRIC VEHICLE CHARGING STATION, by Bonwit et al.;
- Ser. No. 61/350,466, filed on Jun. 1, 2010, entitled AN ELECTRIC VEHICLE CHARGING STATION, by Bonwit et al.; and
- Ser. No. 61/339,749, filed on Mar. 8, 2010, entitled BREAK-AWAY CABLE CONNECTOR, by Petrie et al.

PCT/US2011/027620 is continuation-in-part of the following U.S. Design Patent Applications, which are herein incorporated by reference in their entireties:
- Ser. No. 29/360,201, filed Apr. 21, 2010, entitled ELECTRIC VEHICLE CHARGER, by Petrie et al.; and
- Ser. No. 29/360,300, filed Apr. 22, 2010, entitled ELECTRIC VEHICLE CHARGER, by Petrie et al.

The present application is a continuation-in-part of PCT/US2011/027622, filed on Mar. 8, 2011, entitled DOUBLE WALLED ELECTRIC VEHICLE CHARGING STATION ENCLOSURE, by Bonwit et al., and PCT/US2011/027621, filed on Mar. 8, 2011, entitled ELECTRIC VEHICLE CHARGING STATION ENCLOSURE AND MOUNTING APPARATUS, by Bonwit et al., both herein incorporated by reference in their entireties, which both claim priority of the following U.S. Provisional Patent Applications:
- Ser. No. 61/325,787, filed on Apr. 19, 2010, entitled AN ELECTRIC VEHICLE CHARGING STATION, by Bonwit et al.;
- Ser. No. 61/350,466, filed on Jun. 1, 2010, entitled AN ELECTRIC VEHICLE CHARGING STATION, by Bonwit et al.; and
- Ser. No. 61/339,749, filed on Mar. 8, 2010, entitled BREAK-AWAY CABLE CONNECTOR, by Petrie, et al.

PCT/US2011/027622 and PCT/US2011/027621 are both continuation-in-parts of U.S. Design Patent Applications Nos. 29/360,201 and 29/360,300.

The present application is a continuation-in-part PCT Application No. PCT/US2011/000433, filed Mar. 8, 2011, entitled BREAK-AWAY CABLE CONNECTOR, by Petrie, et al, herein incorporated by reference in its entirety, which claims priority of the following U.S. Provisional Patent Applications:
- Ser. No. 61/339,749, filed on Mar. 8, 2010, entitled BREAK-AWAY CABLE CONNECTOR, by Petrie, et al.;
- Ser. No. 61/397,984, filed on Jun 18, 2010; and
- Ser. No. 61/460,413, filed on Jun 18, 2010.

BACKGROUND

In electric vehicle charging systems, a charging station enclosure has a requirement for supporting a charging station cable and protecting internal electrical and electronic components of the electric vehicle charging station.

As effective electric vehicles are becoming more feasible and more desirable, there will be an increased interest in home-based and commercial charging stations. To minimize charging times, it is desirable to use a high voltage (e.g., 240 volt) charging system. When using such systems there are both safety considerations and safety laws that need to be addressed to minimize the risk to homeowners and their property. Technologies addressing these considerations may also be useful to improve vehicle charging stations in industrial and commercial settings.

The charging station in a home, commercial, or industrial environment will be exposed to extreme environmental factors of temperature, moisture, and sun light. To protect the electrical and electronic circuitry of the charging station must be able to withstand the extreme environmental factors.

Further, the charging station cable will be attached directly to the charging station enclosure. The charging station cable may be yanked to cause extreme stress on the charging station enclosure if, for instance, the driver leaves the charging station cable attached and drives away. Such a scenario will cause excess torquing of the charging station at its connection points to a solid structure and potentially could cause damage to the charging station enclosure.

Additionally, the charging station cable requires a provision for storing the charging station cable. When not in use the charging station cable must be placed attached to or near the charging station enclosure. Such a storage facility must be convenient for the user to take from the storage and to replace in its storage position.

Therefore what is needed is a charging station configured to cope with structurally damaging forces and extreme environments, while minimizing the likelihood of exposing live electrical parts to people or flammable property. Further, what is needed is a charging station with a provision for storage of a charging station cable.

SUMMARY

In one possible embodiment, a charging station is provided having a housing including a back side and a front user interface side opposing the back side. In this embodiment, the charging station further includes a generally curved upward facing surface between the back side and the front user interface side which is adapted to receive a charging cable. The upward facing surface has a cable retaining portion adjacent to the user interface side, the cable retaining portion having a radius larger than a radius of a portion between the cable retaining portion and the back side of the housing.

In some embodiments, an enclosure for a charging station is provided having a peripheral casing configured to retain a charging cable on an upward facing surface of the peripheral casing between a first portion of the peripheral casing and a charging station mounting surface.

In various embodiments, an enclosure for a charging station is provided having a peripheral casing configured to retain a charging cable on an upward facing surface of the peripheral casing between a front user interface side and a charging station mounting surface.

BRIEF DESCRIPTION OF THE DRAWINGS

FIGS. 11A-11D are drawings of a back wall mounting plate of an embodiment of an electric vehicle charging station.

DESCRIPTION

Figure 1:
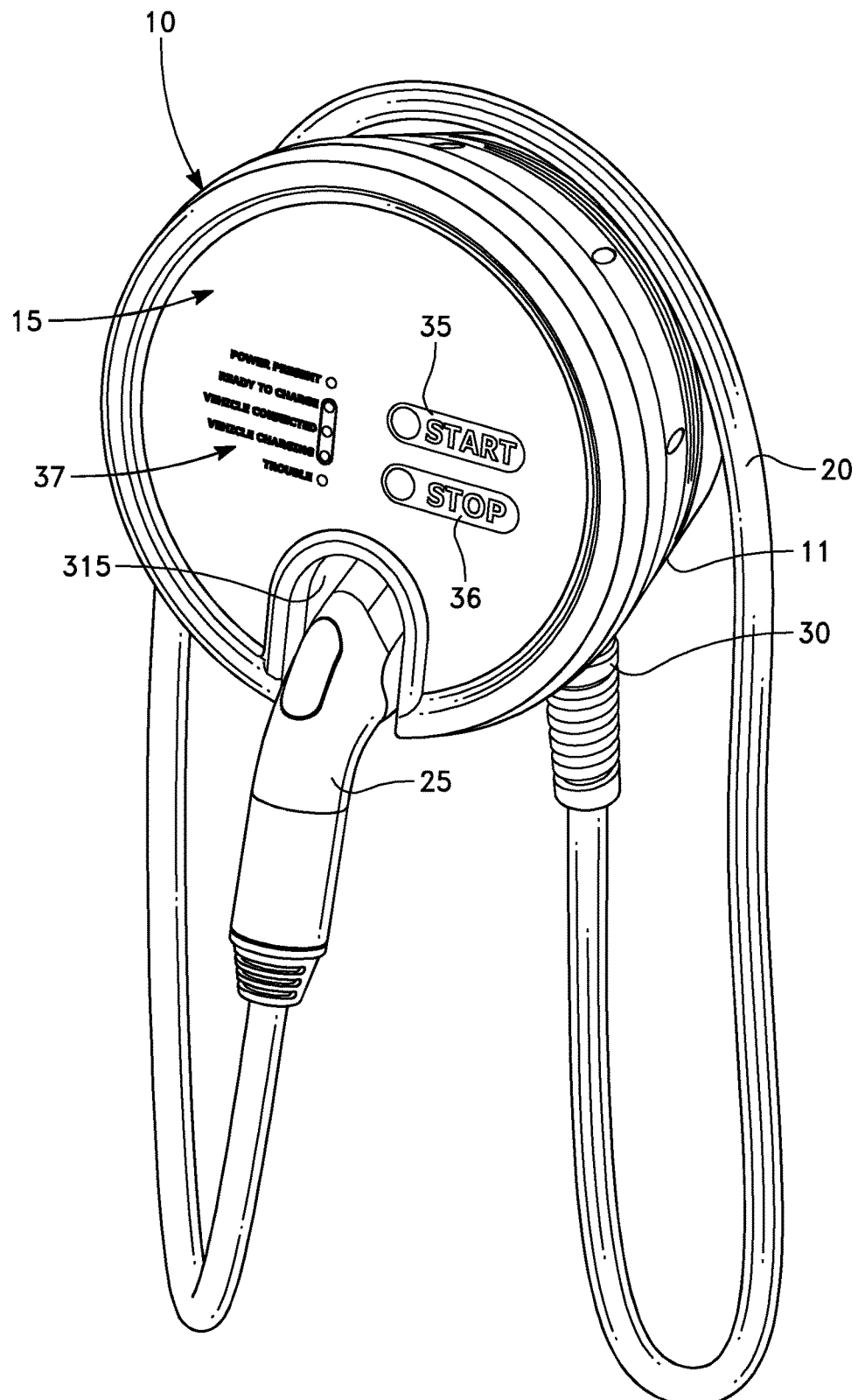
FIG. 1 is a front perspective drawing of a possible embodiment of an electric vehicle charging station.

FIG. 1 is a front perspective drawing of an embodiment of an electric vehicle charging station. The charging station enclosure 10 is generally a truncated conical section that contains the power distribution circuitry for charging an electric vehicle. A front plate 15 is secured to an edge of a front opening of the peripheral casing 11 of the charging station enclosure 10 where the inner surface of the front edge of the peripheral casing 11 has a generally circular surface. The front edge of the peripheral casing 11 has a number of holes to receive fasteners such as screws that secure the front plate 15 to the charging station enclosure 10. A pliable O-ring is situated between the front plate 15 and the front edge of the peripheral casing 11 of the charging station enclosure 10 to seal the interior of the charging station enclosure 10 from the exterior environment.

The front plate has openings through which controls such as a start switch 35, stop switch 35 and condition indicators 37 are placed. A cable connector 30 is attached to the charging station enclosure 10 to allow connection to energy distribution circuitry 200 of FIG. 5 that is used for the transferring electrical energy to the electric vehicle being charged. The cable connector 30 is connected to an energy transfer conduit such as a flexible, elongated power cable 20 having a length sufficient for connecting to the electric vehicle. The diameter of the power cable 20 being dependent upon the amount of current carried by the power cable 20 and the environmental and usage requirements for the distribution of electrical energy from the electric vehicle charging station. Secured to the distal end of the power cable 20 is an electric vehicle charging interface connector 25 that is attached to a charging port of the electric vehicle for the transfer of the electrical energy to the electric vehicle for charging.

Figure 2:
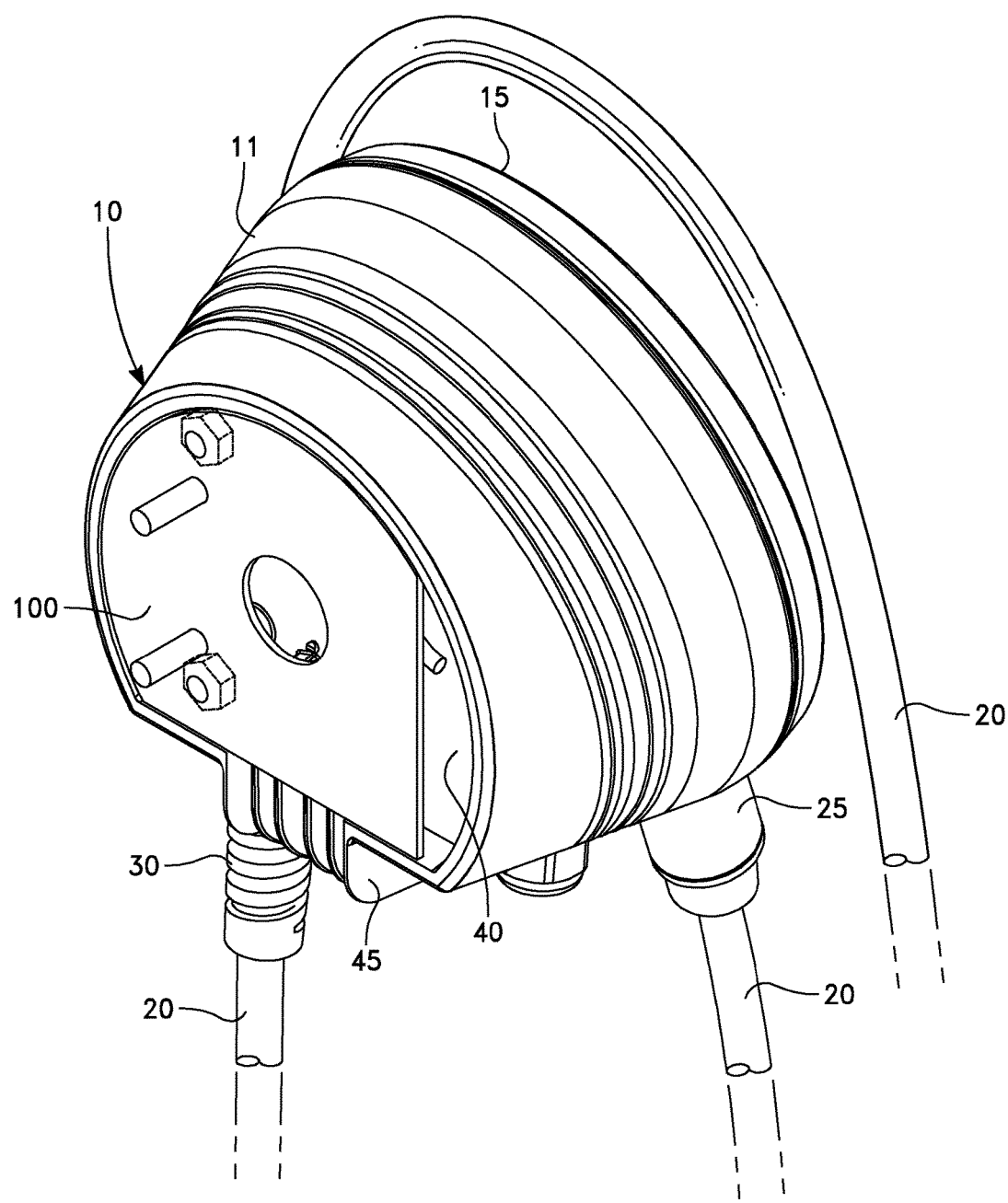
FIG. 2 is rear perspective drawing of a possible embodiment of an electric vehicle charging station.

FIG. 2 is rear perspective drawing of an embodiment of an electric vehicle charging station. The truncated conical section of the charging station enclosure 10 is placed such that the larger diameter side is the front opening of the peripheral casing 11 to which the front plate 15 is attached. The smaller diameter is placed at the rear surface 40 of the charging station enclosure 10. The rear of the charging station enclosure 10 is attached to a vertical mounting surface such as a wall or pole. The charging station enclosure 10 is attached to the vertical mounting surface through a back plate 100. The back plate 100 is connected to the vertical mounting surface and the charging station enclosure 10 is mounted to the back plate 100.

Figure 3A:
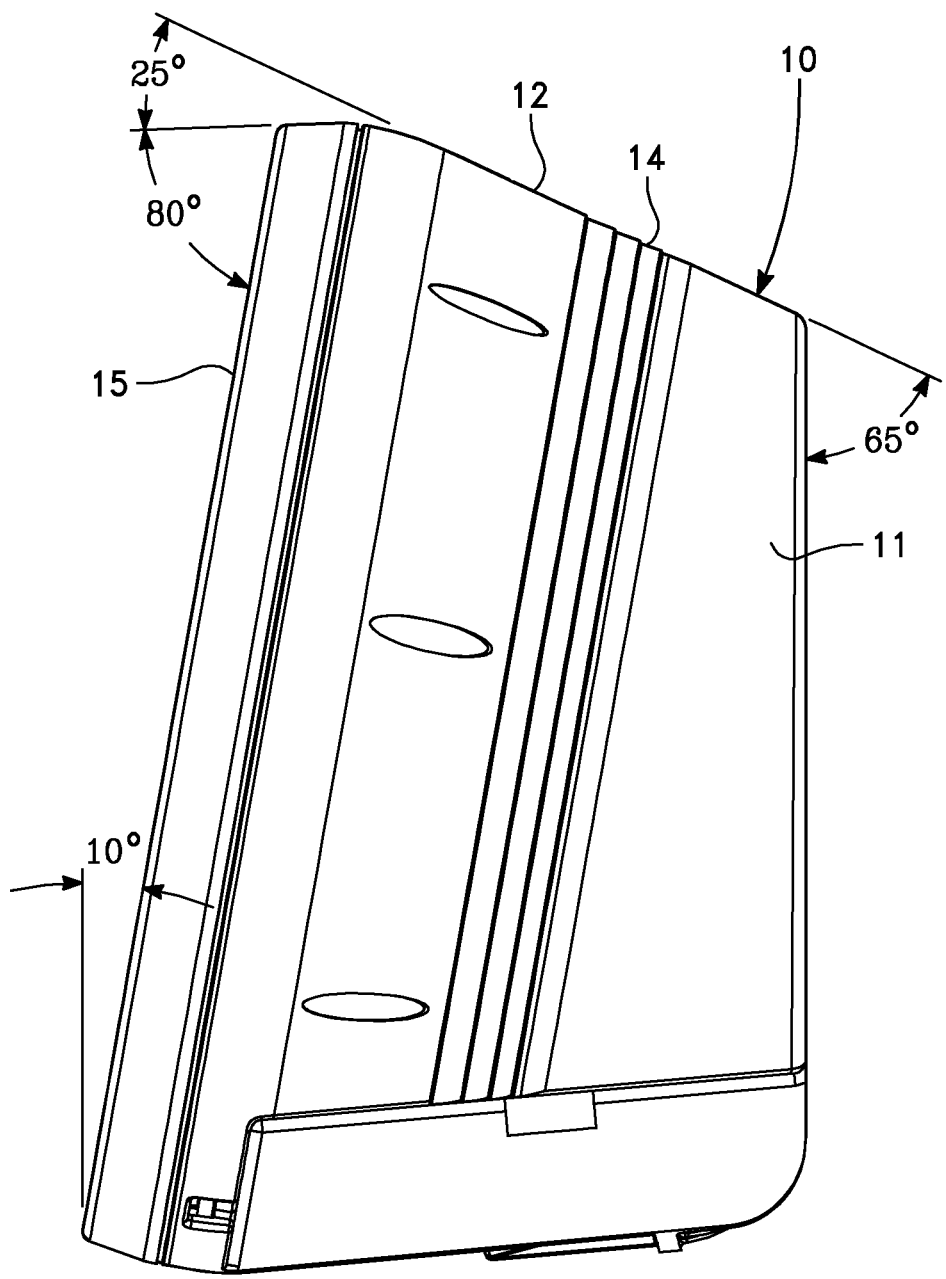
FIG. 3A is a drawing of a side view of a possible embodiment of an electric vehicle electric vehicle charging station.
Figure 3B:
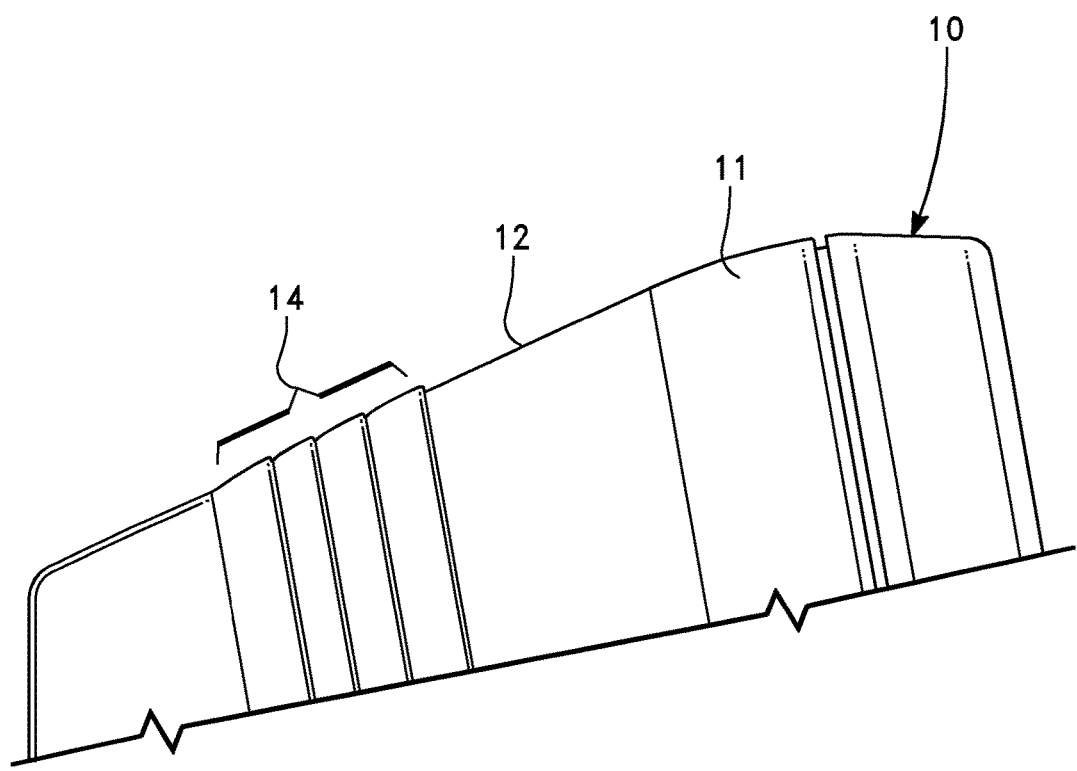
FIG. 3B is an enlarged partial side view of the embodiment of FIG. 3A.

FIG. 3A is a drawing of a side view of an embodiment of an electric vehicle charging station. FIG. 3B is an enlarged partial side view of the embodiment of FIG. 3A. The truncated conical section of the charging station enclosure 10 is formed such that the top edge 12 of the peripheral casing 11 has an angle of approximately 25° (with a range of from 10° to 45° from a horizontal plane) or 65° from a vertical plane. This angle permits the power cable 20 of FIG. 1 to be draped over the top edge 12 of the peripheral casing 11 of the charging station enclosure 10 to allow ease of removal of the power cable 20 for connection to the electric vehicle. An advantage of providing a means for supporting cable 20 by using the charging station enclosure 10 is that it eliminates the need for a separate cable hanger, and thus reduces space and lowers the overall system cost. The peripheral casing 11 has steps 14 of ridges and grooves formed in the surface of the peripheral casing 11 to facilitate retention and release of the power cable 20 of FIG. 1 when it is stored on the top edge 12 of the peripheral casing 11 of the charging station enclosure 10. The front plate 15 is placed at an angle of approximately 80° to a horizontal axis or equivalently 10° to a vertical axis. These angles may vary or be adjusted in other embodiments. The angled front plate 15 facilities viewing of the charging station front plate from slightly above the front plate 15, to allow the charging station enclosure 10 to be conveniently mounted at a lower level than a user's head while still having the front plate 15 generally facing the user's head. Further, it allows the electric vehicle charging station to comply with federal or local laws requiring a maximum height, i.e. 48 inches, to facilitate access by disabled users, while still being very usable by standing users.

Figure 4:
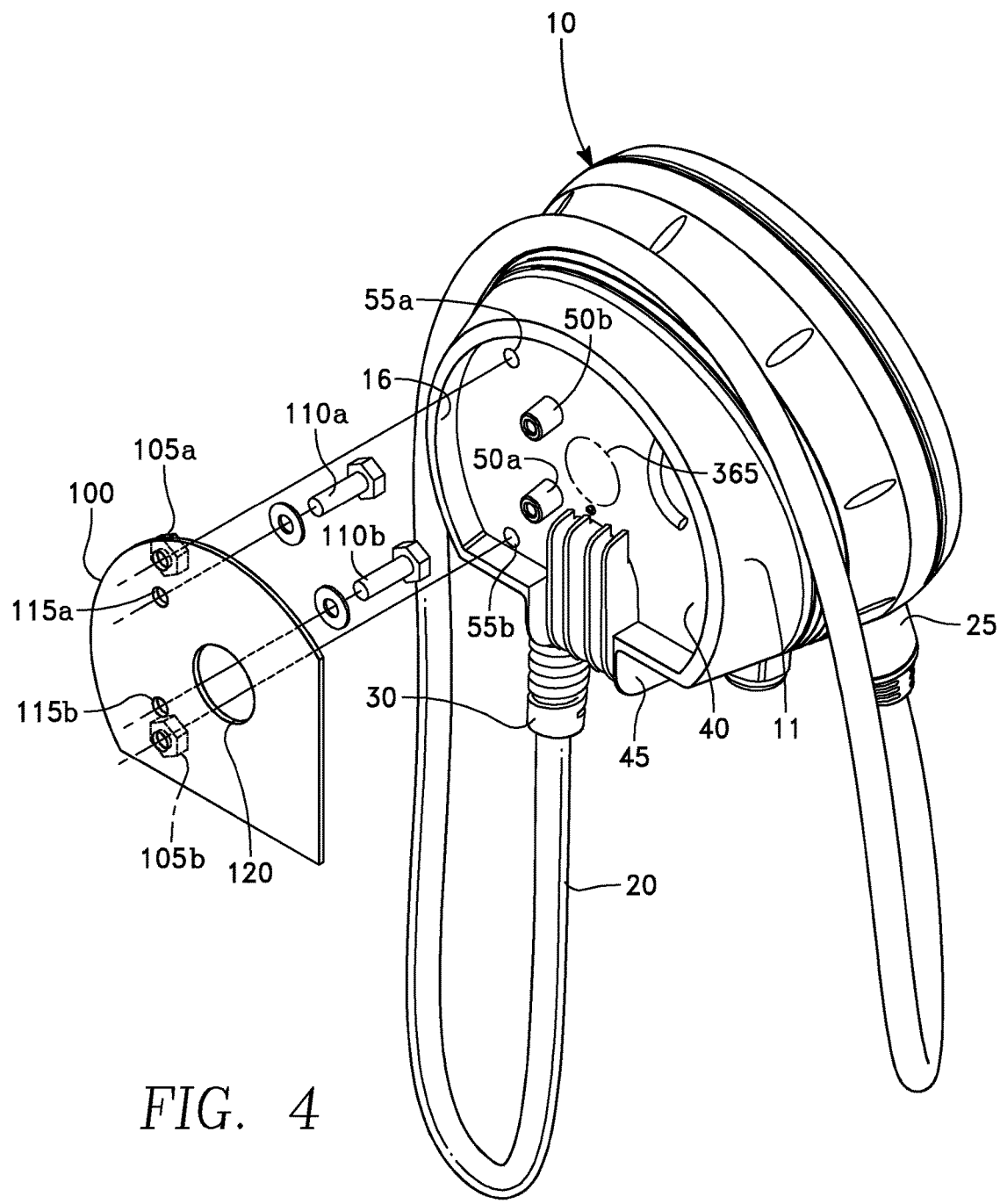
FIG. 4 is an exploded rear perspective view of a possible embodiment of an electric vehicle charging station.

FIG. 4 is an exploded rear perspective drawing of an embodiment of an electric vehicle charging station. The charging station enclosure 10 has a rear surface 40 that is recessed into the peripheral casing 11 of the charging station enclosure 10. The rear surface 40 has stiffening plates 45 formed in the rear surface 40 and the bottom surface of the charging station enclosure 10 to provide necessary stiffening of the charging station enclosure 10 to inhibit damage from the insertion of the electric vehicle charging interface connector 25 and from the weight of the power cable 20 when it is placed at the top edge 12 of the charging station enclosure 10.

The rear surface 40 has standoffs 50a and 50b that inhibit the back plate 100 from being improperly placed when the electric vehicle charging station is mounted to the back plate 100. The rear surface 40 further has fastener openings 55a and 55b for securing fasteners to join the back plate 100 to the rear surface 40 of the charging station enclosure 10. The embodiment as shown has two fastener openings 55a and 55b. In other embodiments, there may be any number of openings for securing the back plate 100 to the rear surface 40.

The rear surface 40 has an opening 365 that is aligned with the opening 120 of the back plate 100. The cable openings 365 and 120 are aligned to allow an energy delivery cable (not shown) into the charging station enclosure 10 from wall directly behind the charging station enclosure 10 to connect to the energy distribution circuitry 200 of FIG. 5 within the charging station enclosure 10. Optionally, the energy delivery cable (not shown) may be routed via an electrical conduit (not shown) external to the wall (not shown) and enter the enclosure 10 through an alternate cable opening 330 (FIGS. 7A and 7B) in the bottom of the charging station enclosure 10. In such a case, an optional tab 335 may cover the cable opening 365. Or if the energy delivery cable enters through the back cable opening 365, an optional tab (not shown) may cover the alternate cable opening 330. Or, one or both of the cable openings 365 and/or 330 may be solid initially and thereafter drilled to make the required cable opening 365 or 330. The back plate 100 has fasteners 105a and 105b that receive the mating fasteners that are attached to the openings 55a and 55b. The back plate 100 has openings 115a and 115b that receive the fasteners 110a and 110b that are to attach the back plate 100 to the vertical surface (wall or pole). The back plate 100 having a separate connection to the vertical surface from the charging station enclosure 10 permits a variety of connections between the charging station enclosure 10 and the vertical surface and meets necessary regulatory requirements that the energy distribution circuitry 200 of FIG. 5A not have a direct connection to the vertical surface to which it is mounted.

In various embodiments, the charging station cable 20 has a cable connector 30 that is structured to breakaway from the charging station enclosure 10 whenever the charging station cable 20 is placed under extreme tension. As noted in Petrie et al., it is anticipated that the electrical vehicle charging station may be used in residential garages to charge personal vehicles. A 240 volt residential power system could provide for overnight vehicle charging. In such a setting, it is anticipated that less-than ideal conditions might exist. For example, a garage can be expected to be filled with objects that could interfere with easy access to the charging station. Moreover, the vehicle may end up parked in a position that places its charging port far from the charging station console. Additionally, while charging is taking place, pets, children and adults may want to pass between the charging station console and the charging port.

As was previously noted, in such a setting there are many possible situations in which a charging station cable 20 may be physically abused. For example, while extending the cable to the vehicle, a user may yank or whip the cable to get it passed an obstacle. Also, while the cable is attached to a vehicle, a person or object could inadvertently strike the cable, placing it in high tension. It is also possible that a vehicle could be driven away while the vehicle connector is still attached to the vehicle.

Petrie et al. provides a mechanical weak link in the cable. The weak link is configured to fail in a way that limits risks to a user. More particularly, this weak link limits the risk that such events cause damage to the charging station enclosure 10 and potentially expose users or flammable materials to a high-power power source.

Figure 5A:
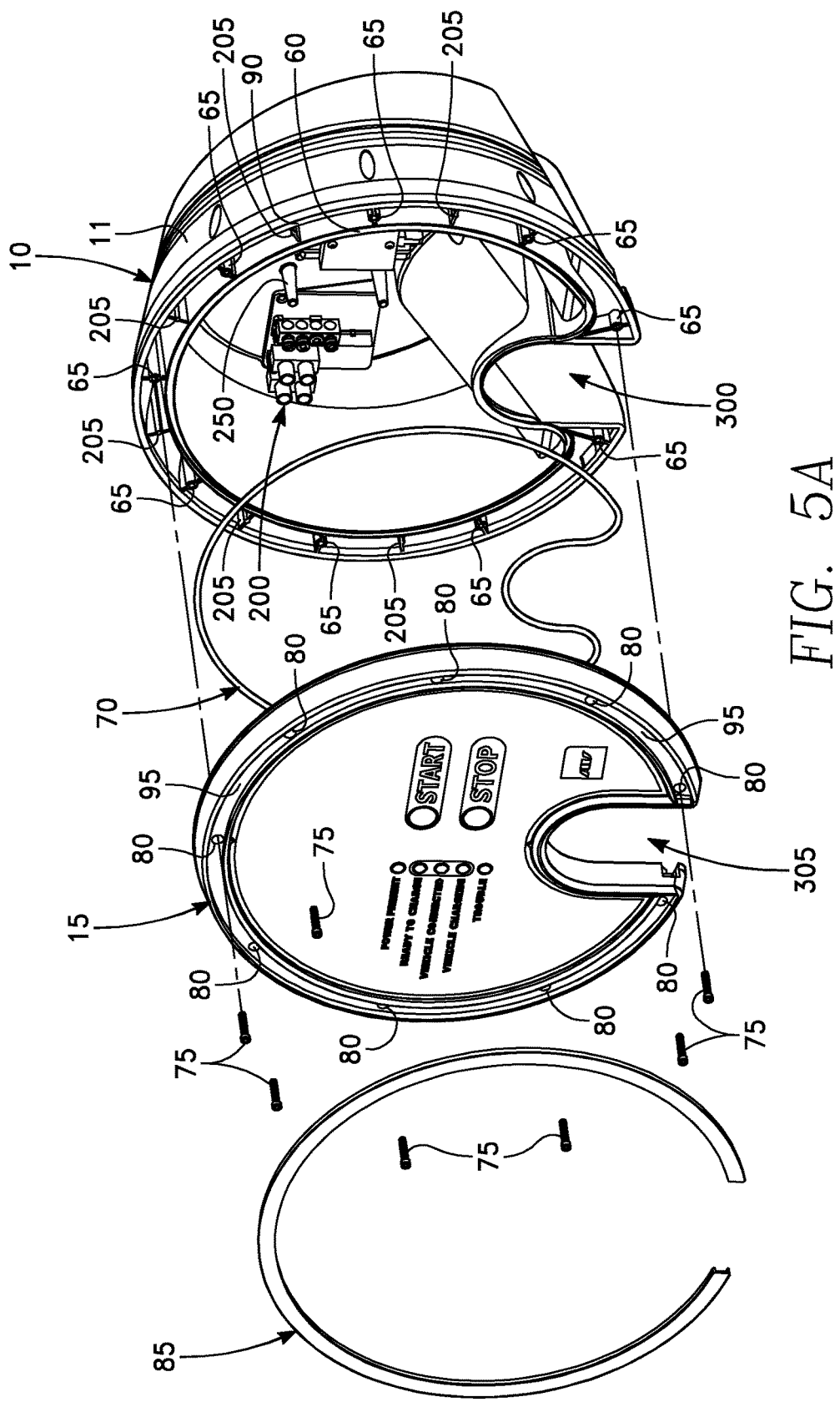
FIG. 5A is a drawing showing a perspective exploded view of an embodiment of electric vehicle charging station.
Figure 5B:
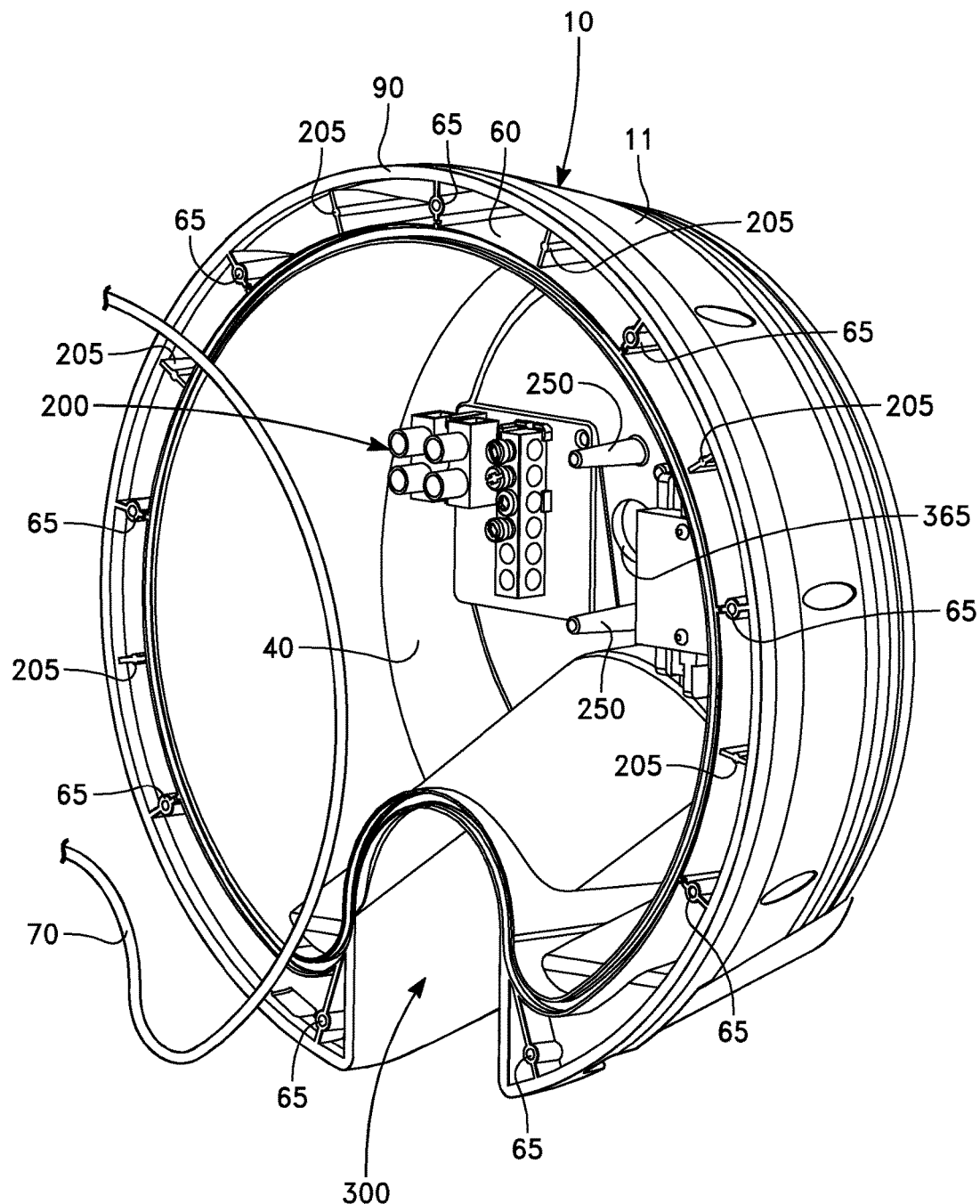
FIG. 5B is a drawing showing a perspective view of the embodiment of the interior of an electric vehicle charging station of FIG. 5A illustrating placement of the wiring, electrical connectors, and electrical and electronic circuitry.
Figure 5C:
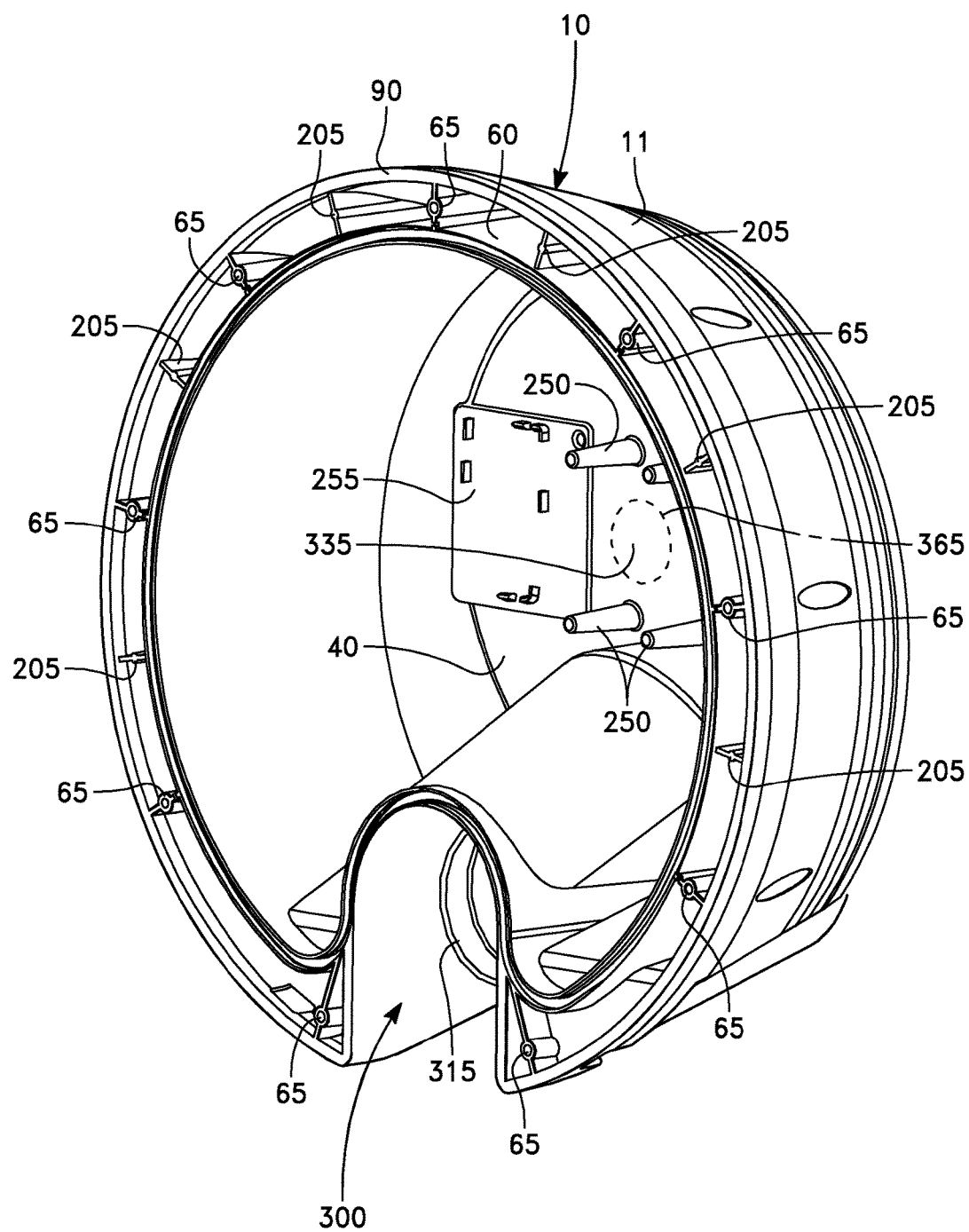
FIG. 5C is a drawing showing a perspective view of the embodiment of the interior of an electric vehicle charging station of FIG. 5B illustrating the interior of the electric charging station enclosure.
Figure 5D:
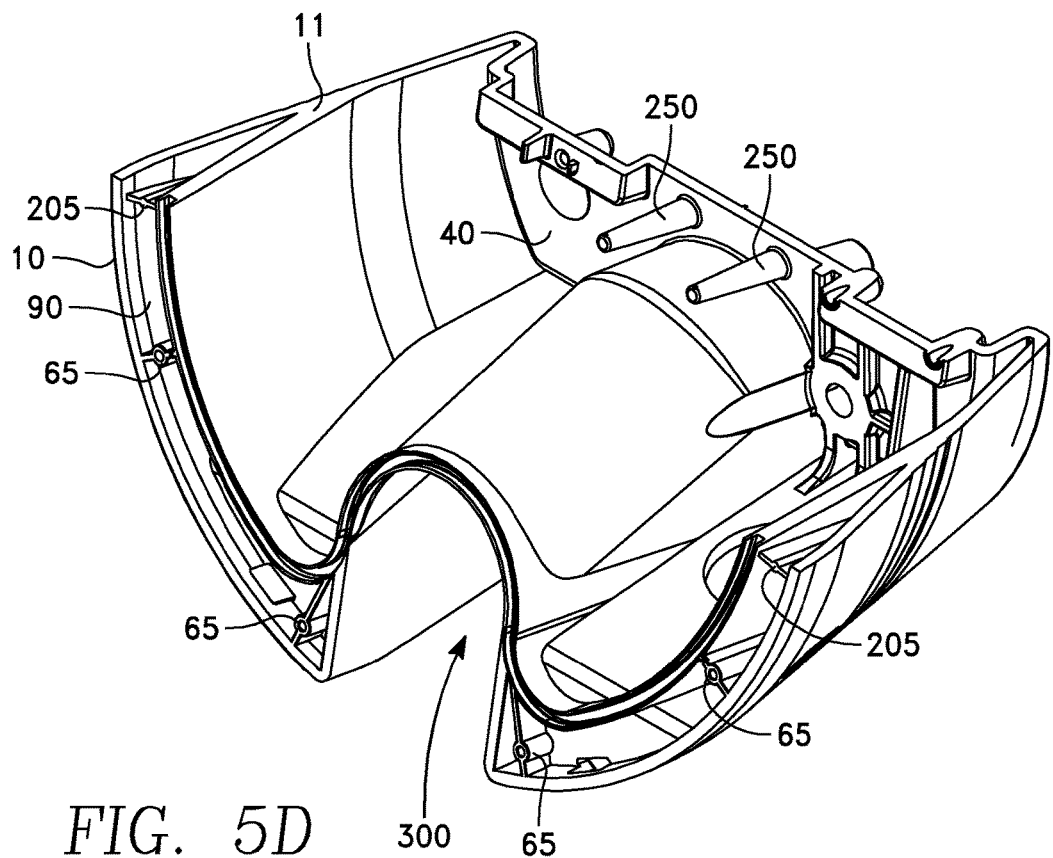
FIG. 5D is a drawing showing a cross sectional view of an embodiment of the electric charging station enclosure of FIG. 5C.
Figure 5E:
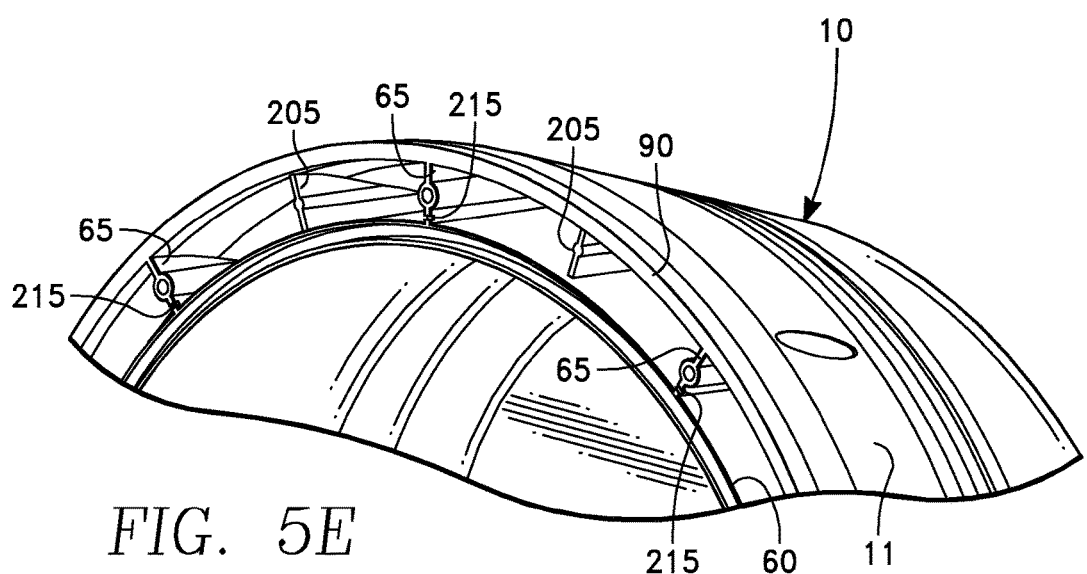
FIG. 5E is a drawing showing a perspective view of the embodiment of the electric charging station enclosure of FIG. 5C illustrating the double wall structure of the charging station enclosure.
Figure 5F:
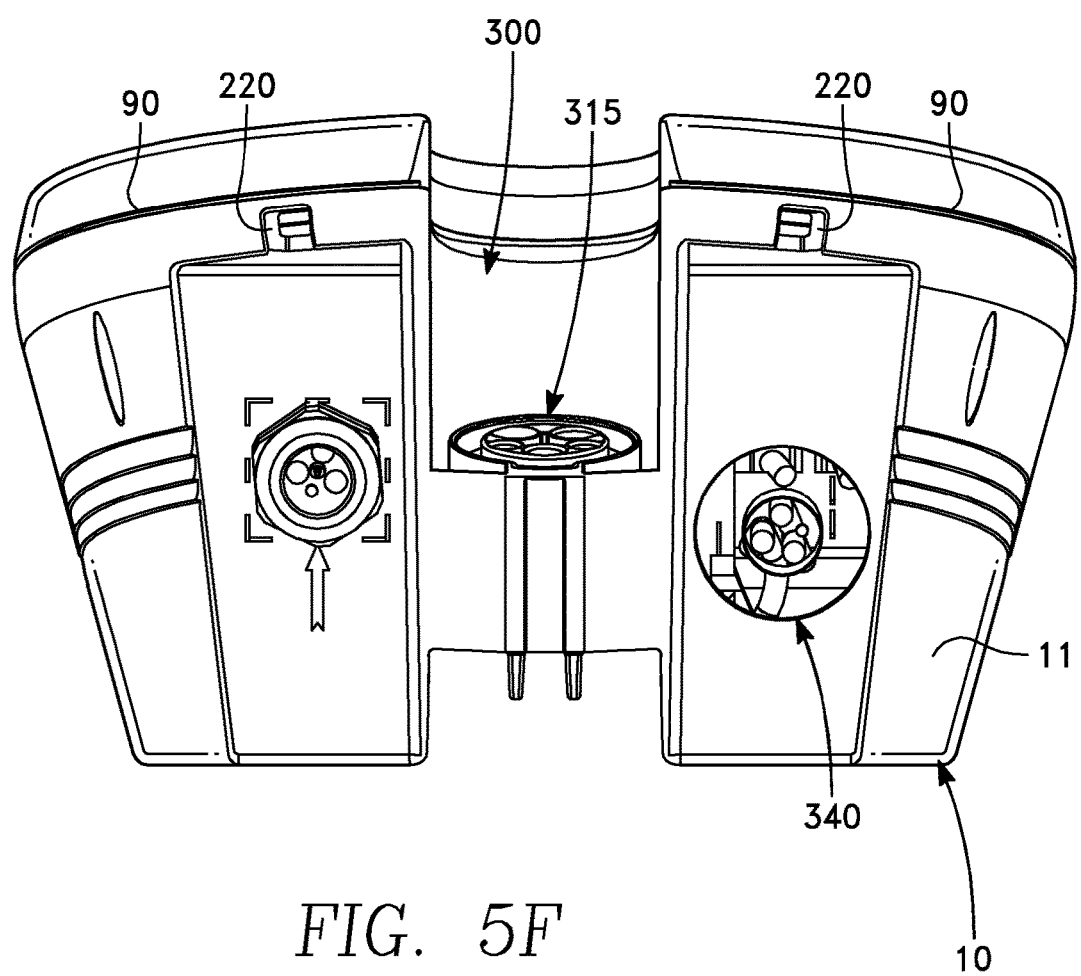
FIG. 5F is a drawing showing a bottom view of the embodiment of the electric charging station enclosure of FIG. 5C.

Prior to the breaking away of the charging station cable 20, the charging station enclosure 10 is under increased torquing moments at the cable receiving connector opening 340 of FIGS. 5F and 7. This torque is transferred to the openings 55a and 55b for securing fasteners to join the back plate 100 through the fasteners 105a and 105b to the rear surface 40 of the charging station enclosure 10. The locations of the openings 55a and 55b for securing fasteners to join the back plate 100 are located to minimize the effects of this torque to inhibit damage to the charging station enclosure 10. Similarly, the locations of the fasteners 105a and 105b on the back plate are located such that the effects of the torque inhibit any damage to the structure to which the electric vehicle charging station is mounted.

The openings 55a and 55b, as located on the rear surface 40 of the charging station enclosure 10, are approximately aligned vertically with the axis of the cable connector 30. The alignment of the openings 55a and 55b with the cable connector 30 minimizes the effects of the torquing due to the charging station cable 20 being under tension in a breakaway situation. The fasteners 105a and 105b on the back plate 100 are aligned with the openings 55a and 55b to receive the fasteners that attach the charging station enclosure 10 to the back plate 100 at the fasteners 105a and 105b. The openings 115a and 115b that receive the fasteners 110a and 110b to attach the back plate 100 to the vertical surface (wall or pole) are also essentially aligned with the axis of the cable connector 30 to inhibit the effects of the torquing when the charging station cable 20 is under tension in a breakaway situation.

FIG. 5A is a drawing showing a perspective exploded view of an embodiment of an electric vehicle charging station. FIG. 5B is a drawing showing a perspective view of the embodiment of the interior of an electric vehicle charging station of FIG. 5A illustrating placement of the wiring, electrical connectors, and electrical and electronic circuitry. FIG. 5C is a drawing showing a perspective view of the embodiment of the interior of an electric vehicle charging station of FIG. 5B illustrating the interior of the electric charging station enclosure. FIG. 5D is a drawing showing a cross sectional view of an embodiment of the electric charging station enclosure of FIG. 5C. FIG. 5E is a drawing showing a perspective view of the embodiment of the electric charging station enclosure of FIG. 5C illustrating the double wall structure of the charging station enclosure. FIG. 5F is a drawing showing a bottom view of the embodiment of the electric charging station enclosure of FIG. 5C. The peripheral casing 11 of the charging station enclosure 10 includes an inner wall 60 and an outer wall 90. The inner wall 60 provides an extra level of isolation and protection for the energy distribution circuitry 200 from the external environment. Between the inner wall 60 and the outer wall 90 are wall support features 65 and 205 to provide support to strengthen the charging station enclosure 10.

The wall support features 65 include fastener receiving locations 65 (screw holes as shown) to receive the fasteners 75 (screws) that secure the front plate 15 to the charging station enclosure 10. The front plate 15 further has holes 80 through which the fasteners 75 pass to be attached to the front edge of the opening in the peripheral casing 11 of the charging station enclosure 10 at the fastener receivers 65. An O-ring 70 that conforms to the shape of the front edge of the peripheral casing 11 is placed on the inner wall 60 and is compressed to provide an environmental seal between the energy distribution circuitry 200 and the external environment. Generally the environmental seal is a waterproof seal, but may include other types of sealing material for isolating the energy distribution circuitry 200 from other environmental contaminants.

The space between the inner and outer walls provide an air gap that provides, or may contain, thermal insulation between the inner and outer walls. This inhibits the outer wall from being heated by the electronics within the housing and inhibits heat flow from outside the housing to the electronics within the housing.

The space between the inner and outer walls provides a chamber or channel that traps any water that intrudes past the edge of the front cover. Also, the inner wall may still provide an environmental seal even if the outer wall is struck, punctured, or scraped so that it becomes inadvertently cracked or otherwise damaged.

Refer now to FIG. 5E. Should moisture be able to enter into the space between the inner wall 60 and the outer wall 90, such as by the outer wall 90 of the charging station enclosure 10 becoming damaged or by any gap or opening between the front plate 15 and the outer wall 90, the wall support features 65 have drainage ports 215 formed in them to allow water to flow past them. The wall support features 205 charging station enclosure 10 are placed such they are recessed to allow a space between the wall support features and the front plate 15 to further permit the passage of water that may enter the space between the inner wall 60 and the outer wall 90. The water is able to flow to the bottom of the charging station enclosure 10 and exits through the drainage openings 220 as shown in FIG. 5F.

A cover plate 85 is provided to be placed over the fasteners 75 in a groove 95 of the front plate 15 to provide a decorative appearance for the front plate 15 and to protect the screws from direct contact with the elements.

The peripheral casing 11 of the charging station enclosure 10 and the front plate 15 have openings 300 and 305 that receive an interface connector receptacle 315 of FIG. 1. The interface connector receptacle 315 provides a latching arrangement to hold the electric vehicle charging interface connector 25 when not in use.

In various embodiments, the interface connector receptacle 315 is constructed as a feature of the charging station enclosure 10 rather than being separately installed in the openings 300. In various embodiments, the charging station enclosure 10 is molded of an organic plastic compound with the interface connector receptacle 315 being formed during the molding process.

The interior view of the rear surface 40, as shown in FIGS. 5A, 5B, and 5C, have the mounting positions 255 for the energy distribution circuitry 200. As shown in FIG. 5C the cable opening 365 with its installed tab 335 is positioned centrally between wiring exclusion spacers 250. The wiring exclusion spacers 250 are features positioned on the rear surface 40 to indicate that the wiring or components of the energy distribution circuitry 200 should not be placed in the area defined by the wiring exclusion spacers 250. The wiring exclusion spacers 250 are to inhibit placement of obstacles in the region of the cable opening 365. During installation of the energy delivery conduit (not shown) through the rear surface 40, the optional tab 335 must be removed. In some embodiments the installation has the cable opening 365 being drilled out of the rear surface 40. The wiring exclusion spacers 250 help insure that there are no obstacles to the drilling of the cable opening 365. In addition, by the wiring exclusion spacers 250 acting to inhibit the movement or relocation of wires or other components into the area defined by the wiring exclusion spacers 250, such wires or other components will not be damaged by drilling into this area.

Figure 6:
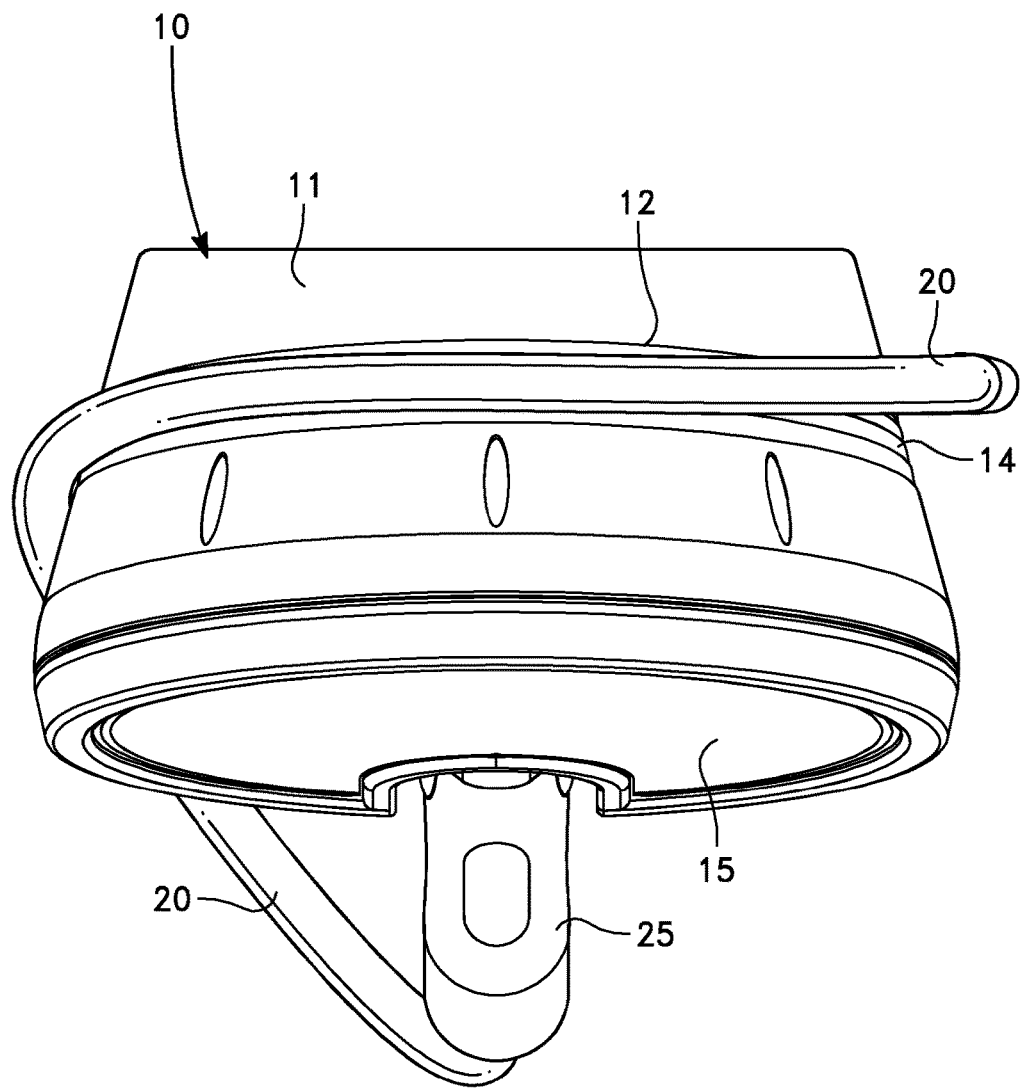
FIG. 6 is a drawing of a top view of an embodiment of an electric vehicle charging station.

FIG. 6 is a drawing of a top view of an embodiment of an electric vehicle charging station. The grooves 14 are illustrated as retaining the power cable 20 as it is draped over the top edge 12 and rests on the outer wall 90 of FIGS. 5A-5F of the peripheral casing 11 of the charging station enclosure 10. The electric vehicle charging interface connector 25 that is connected to the power cable 20 is inserted to the interface connector receptacle 315 that is recessed into the front plate 15 of the charging station enclosure 10.

Figure 7A:
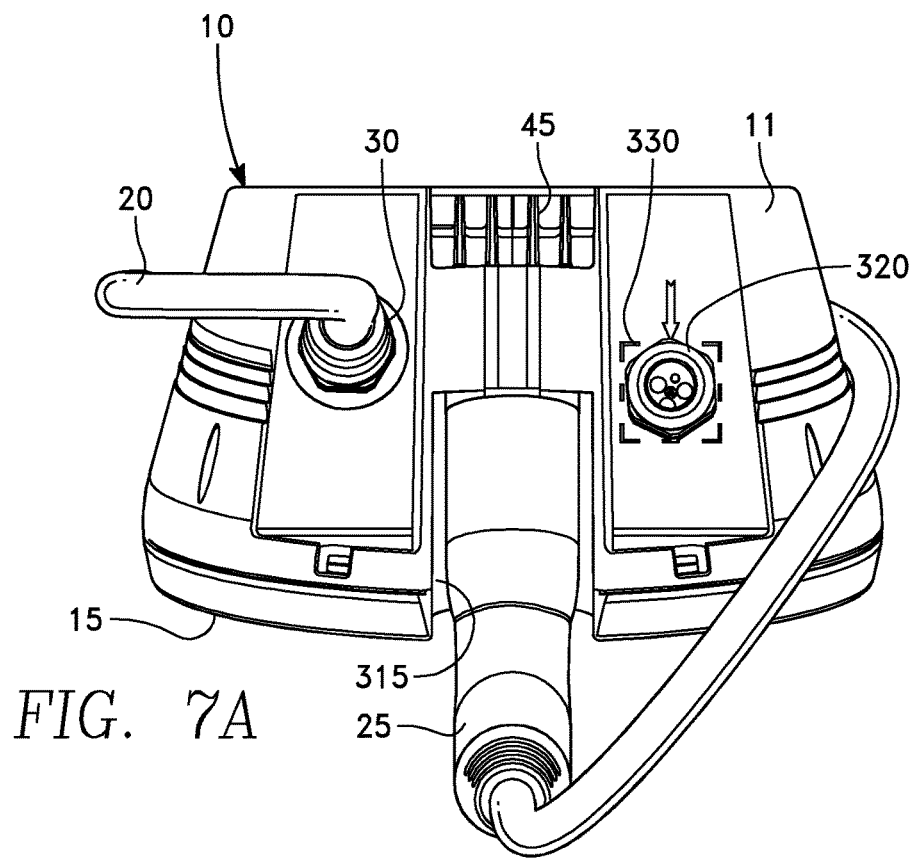
FIGS. 7A and 7B are drawings of a bottom view of an embodiment of an electric vehicle charging station.
Figure 7B:
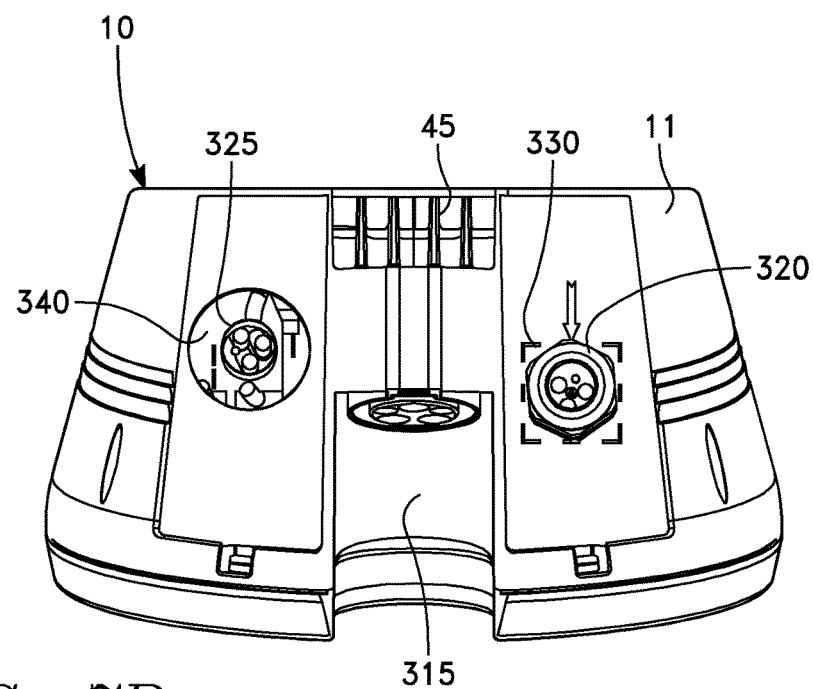

FIGS. 7A and 7B are drawings of a bottom view of an embodiment of an electric vehicle charging station. A second opening 330 in the peripheral casing 11 of the charging station enclosure 10 has an electrical conduit connector 320 that provides an alternative connection point for the energy delivery conduit (not shown). The cable connector 30 is connected to the cable receiving connector 325 that is attached to the peripheral casing 11 of the charging station enclosure 10. The cable connector 30 is connected to the cable receiving connector 325 to allow connection of the energy distribution circuitry 200 of FIGS. 5A and 5B to the power cable 20. The electric vehicle charging interface connector 25 is placed in the interface connector receptacle 315 that is constructed to receive and retain the electric vehicle charging interface connector 25. The interface connector receptacle 315 is constructed to provide isolation from the external environment and protection of the electrical contacts of the electric vehicle charging interface connector 25 when an electric vehicle is not being charged.

The electric vehicle charging interface connector 25 has a plastic ring around the outside that locates it within the interface connector receptacle 315. Inside this ring are 5 metal pins. On the interface connector 25, there is a circular channel that the plastic ring locates in the interface connector receptacle 315. In the interface connector receptacle 315 are plastic locating features for the pins to locate on for storing the connector until the next usage. When the interface connector 25 is seated in any receptacle, a rubber seal on the inside of the plastic ring makes contact with the exterior wall of the inner circular channel of the interface connector receptacle 315 to seal the interface connector 25 from exposure to the external environment.

The stiffening plates 45 formed in the rear surface and the bottom surface of the peripheral casing 11 of the charging station enclosure 10 provide necessary reinforcement of the charging station enclosure 10 to inhibit damage from the insertion of the electric vehicle charging interface connector 25 and from the weight of the power cable 20 when it is placed at the top edge 12 of the charging station enclosure 10.

Figure 8:
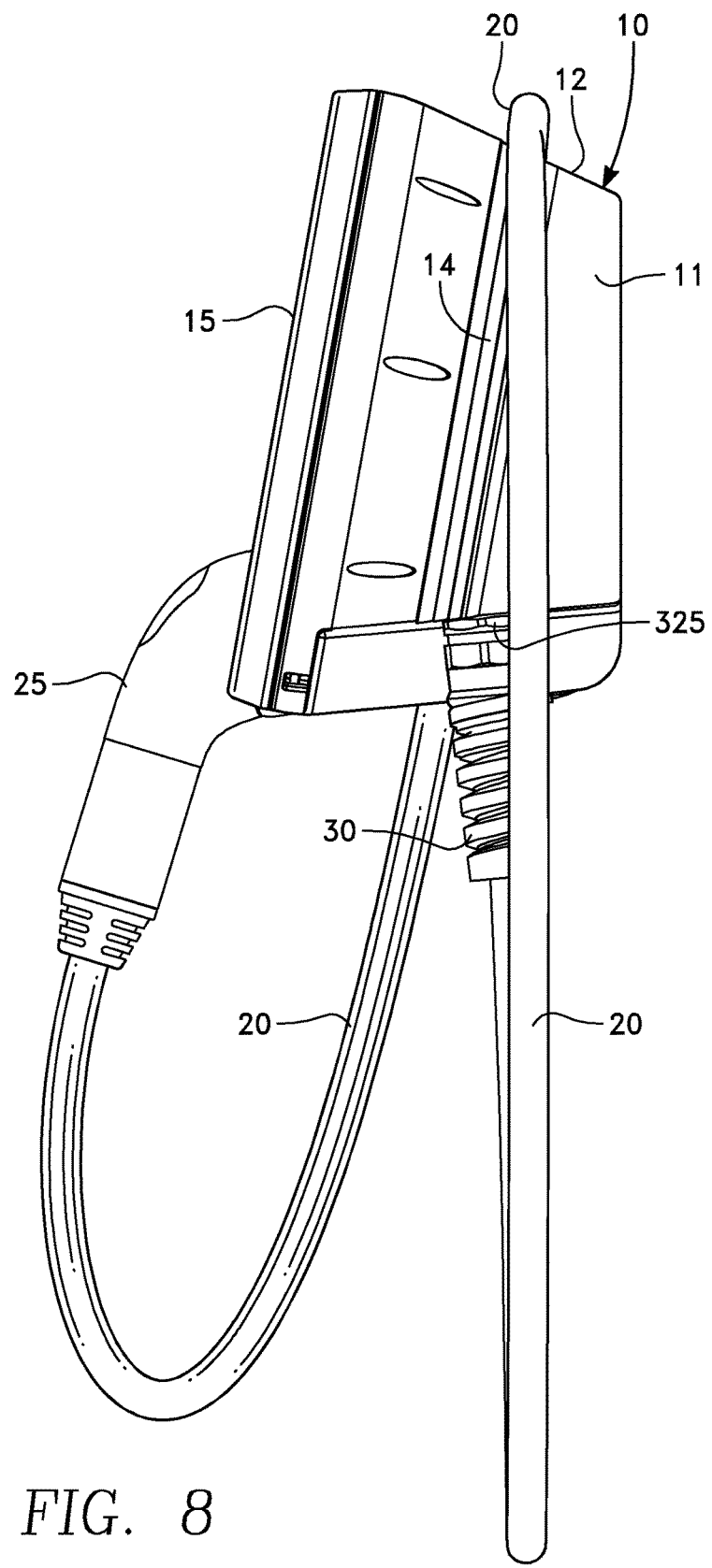
FIG. 8 is a drawing of a right side view of an embodiment of an electric vehicle charging station.

FIG. 8 is a drawing of a right side view of an embodiment of an electric vehicle charging station. The power cable 20 is draped over the top edge 12 of the peripheral casing 11 of the charging station enclosure 10 and frictionally retained by the steps 14 to inhibit the cable from sliding to the vertical surface 400 of FIG. 9 and potentially causing crimping of the power cable 20. The cable connector 30 is connected to the cable receiving connector 325 that is attached to the peripheral casing 11 of the charging station enclosure 10. The cable connector 30 is connected to the cable receiving connector 325 to allow connection of the energy distribution circuitry 200 of FIG. 5 to the power cable 20. The electric vehicle charging interface connector 25 is placed in the interface connector receptacle 315 that is recessed in the front plate 15.

Figure 9:
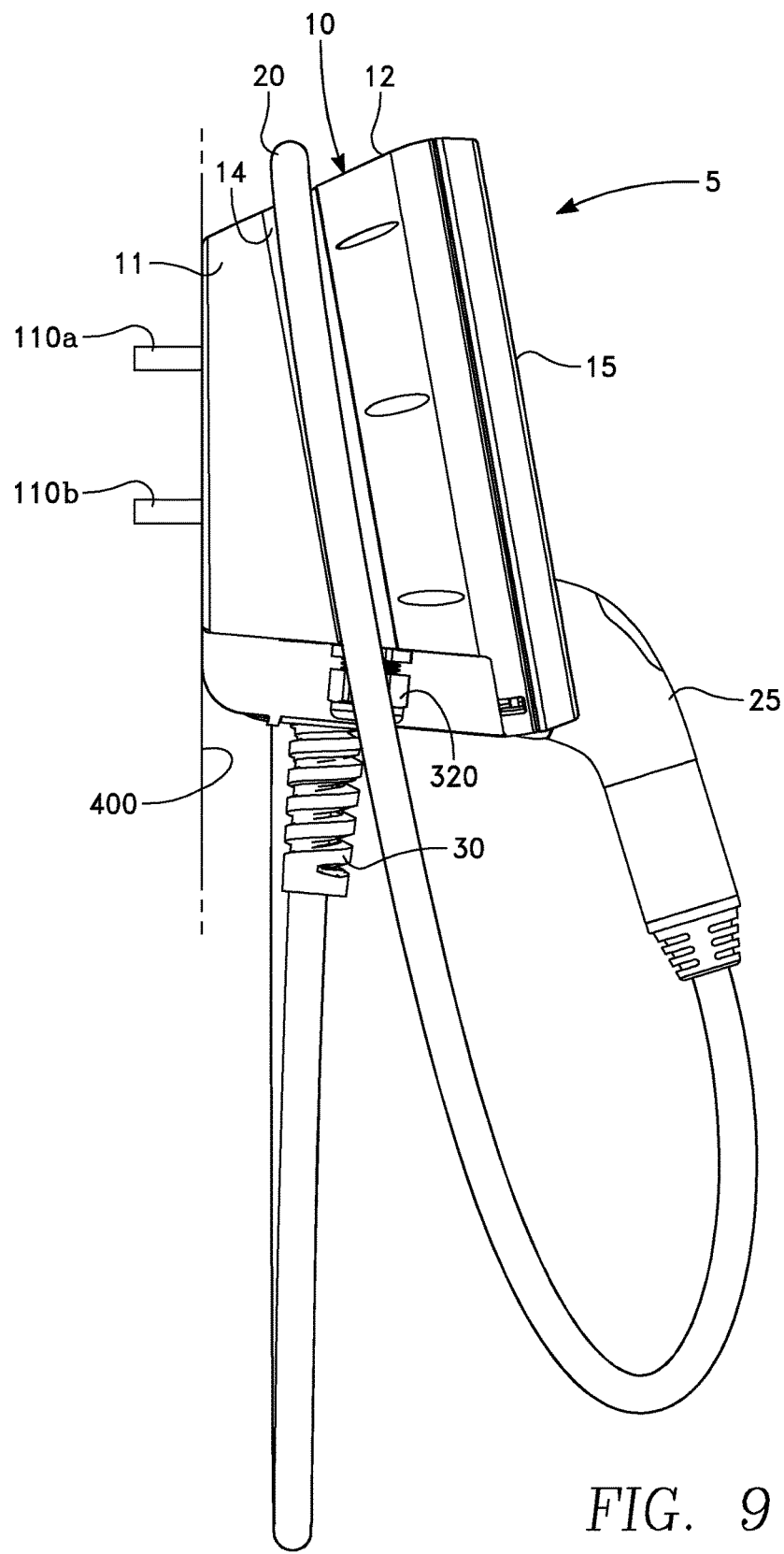
FIG. 9 is a drawing of a left side view of an embodiment of an electric vehicle charging station.

FIG. 9 is a drawing of a left side view of an embodiment of an electric vehicle charging station. The electric vehicle charging station 5 is secured to the vertical surface 400 with the fasteners 110a and 110b. The interface connector receptacle 315 is connected to or integrated with the bottom of the peripheral casing 11 of the charging station enclosure 10. The power cable 20 is draped over the top edge 12 and frictionally retained by the steps 14. The electric vehicle charging interface connector 25 is placed and secured in the interface connector receptacle 315 recessed within the front plate 15. The electrical conduit connector 320 is placed at the bottom of the peripheral casing 11 of the charging station enclosure 10 to allow the energy delivery conduit (electrical cable) to pass through the charging station enclosure 10 to the energy distribution circuitry 200 of FIGS. 5A and 5B. In this embodiment, with the energy delivery conduit (electrical conduit) being placed at the bottom surface of the charging station enclosure 10, the opening 365 in the rear surface 40 of FIG. 4 has the optional tab 335 in place to seal the rear surface from the external environment. Or, in this and other embodiments, the opening 365 may be drilled from a solid portion of the rear surface 40.

Figure 10:
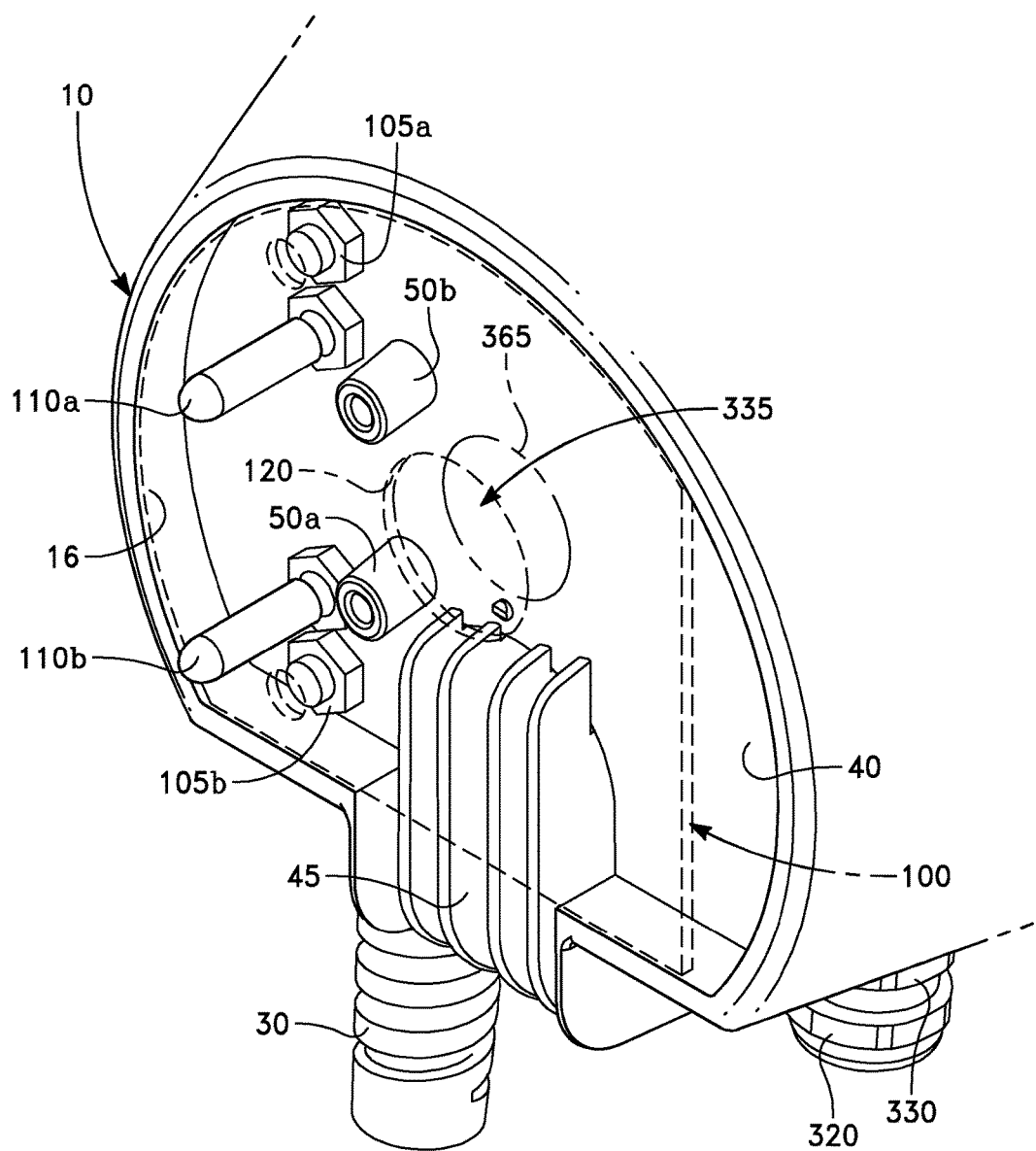
FIG. 10 is a drawing of a rear view of an embodiment of an electric vehicle charging station.

FIG. 10 is a drawing of rear panel of an embodiment of an electric vehicle charging station. The rear surface 40 is recessed into the peripheral casing 11 of the charging station enclosure 10. The rear surface 40 has stiffening plates 45 formed in the rear surface 40 and into the bottom of the peripheral casing 11 of the charging station enclosure 10 to provide necessary reinforcing of the charging station enclosure 10 to inhibit damage from the insertion of the electric vehicle charging interface connector 25 of FIG. 1 and from the weight of the power cable 20 when it is placed at the top edge 12 of the charging station enclosure 10 of FIG. 3.

The rear surface 40 has standoffs 50a and 50b that inhibit the back plate 100 from being improperly placed when the electric vehicle charging station is mounted to the back plate 100. The rear surface 40 further has openings 55a and 55b (FIG. 4) for securing fasteners to join the back plate 100 to the rear surface 40 of the charging station enclosure 10.

The rear surface 40 has an opening 365 that is aligned with the opening 120 of the back plate 100. The cable openings 365 and 120 allow an energy delivery conduit (not shown) into the charging station enclosure 10 from a vertical surface (wall) directly behind the charging station enclosure 10 to connect to the energy distribution circuitry 200 of FIGS. 5A and 5B within the charging station enclosure 10. Optionally, the energy delivery conduit (not shown) may enter via an electrical conduit connector 320 external to the wall (not shown) and through an alternate cable opening 330 in the bottom of the peripheral casing 11 of the charging station enclosure 10. In such a case, an optional tab 335 may cover the cable opening 365. Or, in this and other embodiments, the opening 330 may be drilled from a solid portion bottom surface of the enclosure 10. Conversely an optional tab (not shown) may cover the alternate cable opening 330. The back plate 100 has fasteners 105a and 105b that receive the mating fasteners that are attached to the openings 55a and 55b. The back plate 100 has openings 115a and 115b that receive the fasteners 110a and 110b that are to attach the back plate 100 to the vertical surface (wall or pole). The back plate having a separate connection to the vertical surface from the charging station enclosure 10 permits a variety of connections between the charging station enclosure 10 and the vertical surface and meets necessary regulatory requirements that the energy distribution circuitry 200 of FIGS. 5A and 5B not have a direct connection to the vertical surface to which it is mounted.

FIGS. 11A-11D are drawings of a back wall mounting plate of an embodiment of an electric vehicle charging station. The back plate 100 has fasteners 105a and 105b that receive the mating fasteners that are attached to the openings 55a and 55b of the charging station enclosure 10 of FIGS. 4 and 10. The back plate 100 has openings 115a and 115b that receive the fasteners 110a and 110b that are to attach the back plate 100 to the vertical surface (wall or pole). The back plate 100 having a separate connection to the vertical surface from the charging station enclosure 10 permits a variety of connections between the charging station enclosure 10 and the vertical surface and meets necessary regulatory requirements that the energy distribution circuitry 200 of FIGS. 5A and 5B not have a direct connection to the vertical surface to which it is mounted.

The back plate 100 has an opening 120 that is aligned with the opening 365 of FIGS. 4 and 10. The cable openings 365 and 120 allow an energy delivery conduit (not shown) into the charging station enclosure 10 from a wall directly behind the charging station enclosure 10 to connect to the energy distribution circuitry 200 of FIGS. 5A and 5B within the charging station enclosure 10.

The back plate 100 is constructed from a metal plate or sheet such as an aluminum, steel, or other known material plate. The back plate 100 is constructed such that it satisfies regulatory requirements. Further, the back plate 100 has no visible fasteners and is not visible when used. The vertical and horizontal edges 500 and 505 provide an alignment mechanism for insuring that the back plate 100 is mounted correctly to the vertical surface. The back plate 100 is optional. The electric vehicle charging station can be mounted with or without it.

One of the many advantages of the back plate is that the shape of the back plate 100 allows a bubble level to be used along the vertical and horizontal edges when mounting the back plate 100. The edges allow the back plate 100 to be mounted true before mounting of the charging station enclosure 10, and thus the charging station enclosure mounted to the back plate will be level. Further, the squared size of the back plate 100 also reduces the size of the stock used to manufacture, and allow multiple back plates 100 from the same piece of smaller stock, keeping costs of materials down. Moreover, after the back plate 100 is mounted, a flange portion 16 of the charging station enclosure 10 may be rested on the top curved edge 510 (FIGS. 11A and 11D) of the back plate 100. The curved edge 510 (FIGS. 11A and 11D) allows the charging station enclosure 10 to be turned or rotated to align the openings 55a and 55b with fasteners 105a and 105b, respectively. The curved top edge of the back plate 100 generally restrains the up/down and left/right movement of the charger station housing 10, but allows it to rotate to line up the screw holes in the housing with threads in the back plate 100, or with threads in nuts restrained by the back plate 100. Thus, in some embodiments, the charging station enclosure can be seated and hung from the back plate while the installer does an installation.

Referring to FIGS. 6, 7A, and 7B, one advantage of storing the flexible, elongated power cable 20 over the top of the charging station enclosure 10 is that the radius of curvature of the power cable 20 is better for cable health, as compared to a hook or other means. The round surface of the charging station enclosure 10 keeps the power cable 20 from experiencing greater pressure against the cable, and/or low radius bending (especially localized sharp bending at corners, edges, or the like) than might occur with a hook or a retention means with edges or sharp surfaces. Most of the time the power cable 20 will be stored draped over the top of the charging station enclosure 10. The larger radius of curvature of the charging station enclosure 10 keeps the power cable 20 from over bending, and/or kinking to extend the life of the power cable 20. In addition, due to the configuration, as the power cable 20 is pulled, it can easily roll off the top of the charging station enclosure 10 to dispense easily with little effort by the user. Also, the configuration allows the power cable 20 to be more easily returned over the charging station enclosure 10 when finished.

In some embodiments, the charging station enclosure 10 is constructed of a plastic that may be rotomolded or a fiber reinforced plastic panel. In other embodiments, the charging station enclosure 10 may be constructed metal such as steel or aluminum. While the embodiments of this invention illustrate an electric vehicle charging station, the structure of the charging station enclosure 10 and the back plate 100 are adaptable to other applications and these other application are in keeping with the principles of this invention.

While this invention has been particularly shown and described with reference to the embodiments thereof, it will be understood by those skilled in the art that various changes in form and details may be made without departing from the spirit and scope of the invention.

What is claimed is:

1. An enclosure for a charging station comprising a peripheral casing configured to retain a charging cable on an upward facing surface of the peripheral casing between a first portion of the peripheral casing and a charging station mounting surface, wherein the upward facing surface is continuously curved across the upward facing surface and configured such that the contiuously curved upward facing surface has a substantially same radius of curvature as a longitudinal axis of a charging cable received thereon.

2. The enclosure for the charging station of claim 1, wherein the charging cable is releasably retained on the upward facing surface so that the charging cable is able to slide off the upward facing surface in response to a pulling force exerted on the charging cable from the user interface side of the charging station.

3. The enclosure for the charging station of claim 2, wherein the upward facing portion further comprising a reduced radius portion between the first portion and the front user interface side.

4. The enclosure for the charging station of claim 1 wherein the peripheral casing is curvilinear and has a radius greater than a kinking radius of the charging cable.

5. The enclosure for the charging station of claim 1 wherein the peripheral casing comprises a truncated generally conical section configuration.

6. The enclosure for the charging station of claim 5, wherein the first portion of the peripheral casing has a diameter greater than a diameter of a second portion of the peripheral casing.

7. The enclosure for the charging station of claim 6, wherein the second portion of the peripheral casing is in closer proximity to the charging station mounting surface than the first portion of the peripheral casing for retaining the charging cable.

8. The enclosure for the charging station of claim 1, wherein the peripheral casing has features for retaining the charging cable with the peripheral casing.

9. The enclosure for the charging station of claim 8, wherein the frictional features are at least one of: (a) grooves; or (b) steps, integrated into the peripheral casing.

10. The enclosure for the charging station of claim 1, wherein the upward facing surface is configured so as to form an angle of about 65 degrees with respect to a vertical when mounted.

11. The enclosure for the charging station of claim 1, wherein the upward facing surface is configured so as to form an angle of about 25 degrees with respect to a horizontal when mounted.

12. The enclosure for the charging station of claim 1, wherein peripheral casing is configured to retain the charging cable draped over the upward facing surface of the peripheral casing with a radius of curvature such that a radius of curvature of the peripheral casing supporting the charging cable defines a minimum radius of curvature of the charging cable draped thereover.

13. An enclosure for a charging station comprising a peripheral casing configured to retain a charging cable on an upward facing surface of the peripheral casing between a front user interface side and a charging station mounting surface, wherein the upward facing surface is continuously curved across the upward facing surface and configured such that the contiuously curved upward facing surface has a substantially same radius of curvature as a longitudinal axis of a charging cable received thereon.

14. The enclosure for the charging station of claim 13, further comprising a portion adjacent to the user interface side having a radius larger than a radius of a portion between the user interface side and the charger station mounting surface.

15. The enclosure for the charging station of claim 13, wherein the radius of the portion adjacent to the user interface side with respect to the radius of the between portion is such that a charging cable is releasably retained on the upward facing surface so that the portion adjacent to the user interface side allows the charging cable to slide off the upward facing surface in response to a pulling force exerted on the charging cable from the user interface side of the charging station.

16. The enclosure for the charging station of claim 15, wherein the upward facing surface of the peripheral casing further comprises a reduced radius portion between the portion adjacent to the user interface side and the front user interface side.

17. The enclosure for the charging station of claim 13, wherein the upward facing surface of the peripheral casing comprises a semicircular cross section having a radius so as to inhibit over-bending stress on the charging cable.

18. The enclosure for the charging station of claim 13, wherein the peripheral casing is curvilinear and has a radius greater than a kinking radius of the charging cable.

19. The enclosure for the charging station of claim 13, wherein the peripheral casing comprises a truncated generally conical configuration between the front user interface side and the charging station mounting surface.

20. The enclosure for the charging station of claim 19, wherein a radius of the upward facing surface at the front user interface side is greater than a radius of a portion of the upward facing surface at the charging station mounting surface.

21. The enclosure for the charging station of claim 19, wherein the peripheral casing comprises surface features for retaining the charging cable with the peripheral casing.

22. The enclosure for the charging station of claim 21, wherein the features comprise at least one of: (a) grooves; or (b) steps.

23. The enclosure for the charging station of claim 22, wherein the features are formed into the peripheral casing.

24. The enclosure for the charging station of claim 13, wherein the upward facing surface is configured so as to form an angle of about 65 degrees with respect to a vertical when mounted.

25. The enclosure for the charging station of claim 13, wherein the upward facing surface is configured so as to form an angle of about 25 degrees with respect to a horizontal when mounted.

26. The enclosure for the charging station of claim 13, wherein peripheral casing configured to retain the charging cable draped over the upward facing surface of the peripheral casing with a radius of curvature such that a radius of curvature of the peripheral casing supporting the charging cable defines a minimum radius of curvature of the charging cable draped thereover.

27. An enclosure for a charging station comprising a peripheral casing configured to retain a charging cable draped over a top of the peripheral casing such that a radius of the peripheral casing defines a minimum radius of curvature of the charging cable, wherein the top of peripheral casing is configured such that the top of peripheral casing is continuously curved so that the top of peripheral casing has a substantially same radius of curvature as a longitudinal axis of a charging cable received thereon.

28. The enclosure for the charging station of claim 27, wherein the peripheral casing is configured with a large radius of curvature without edges to inhibit pressure against a charging cable draped thereover so as to inhibit over bending of the charging cable.

29. The enclosure for the charging station of claim 27, wherein the peripheral casing comprises an upward facing portion comprising a generally semicircular cross section.

30. The enclosure for the charging station of claim 29, wherein the peripheral casing comprises a truncated conical section.

31. The enclosure for the charging station of claim 27, wherein the peripheral casing is configured without lateral edge surfaces supporting the charging cable thereover.

* * * * *